(12) United States Patent
Aono et al.

(10) Patent No.: US 7,768,798 B2
(45) Date of Patent: Aug. 3, 2010

(54) COMPONENT ACCOMMODATING CASE AND ELECTRONIC APPARATUS

(75) Inventors: Munetoyo Aono, Matsumoto (JP); Naoyuki Fujimori, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 554 days.

(21) Appl. No.: 11/567,642

(22) Filed: Dec. 6, 2006

(65) Prior Publication Data

US 2007/0127203 A1 Jun. 7, 2007

(30) Foreign Application Priority Data

Dec. 7, 2005 (JP) ............................. 2005-352923

(51) Int. Cl.
*B41J 29/13* (2006.01)
*H05K 5/00* (2006.01)
*H05K 1/00* (2006.01)
*H05K 7/00* (2006.01)
*H05K 9/00* (2006.01)

(52) U.S. Cl. .................. 361/818; 347/108; 361/679.01; 361/748; 361/752; 361/760; 361/816

(58) Field of Classification Search .................. 347/108
See application file for complete search history.

(56) References Cited

U.S. PATENT DOCUMENTS 6,249,295 B1 * 6/2001 Kiyohara et al. ............ 346/134

FOREIGN PATENT DOCUMENTS

| JP | 06-112681 | 4/1994 |
|----|-----------|--------|
| JP | 06-152177 | 5/1994 |
| JP | 06-196891 | 7/1994 |
| JP | 10-022675 | 1/1998 |
| JP | 11-214941 | 8/1999 |
| JP | 2001-268291 | 9/2001 |

* cited by examiner

*Primary Examiner*—Matthew Luu
*Assistant Examiner*—Kendrick X Liu
(74) *Attorney, Agent, or Firm*—Workman Nydegger

(57) ABSTRACT

A component accommodating case for accommodating an electronic component that is connected to a wire includes a cutout portion that passes the wire therethrough, an external case that covers at least a surface where the cutout portion is disposed, and a plate member that covers the cutout portion and that is mounted to the external case.

4 Claims, 13 Drawing Sheets

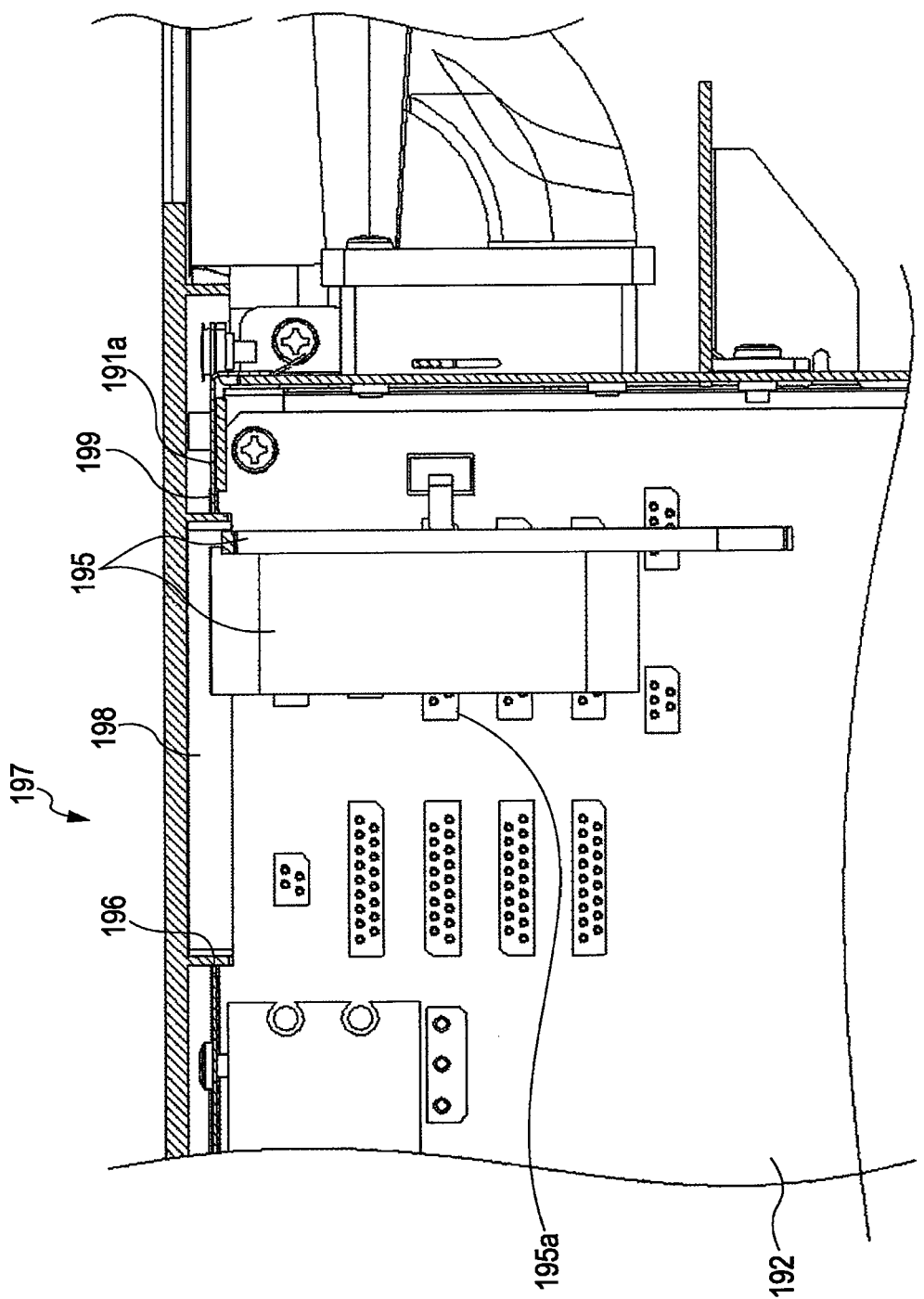

COMPONENT ACCOMMODATING CASE AND ELECTRONIC APPARATUS

BACKGROUND

1. Technical Field

The present invention relates to a component accommodating case that accommodates an electronic component and an electronic apparatus including the component accommodating case.

2. Related Art

In general, a circuit element that is used in an electronic apparatus is mounted to a circuit substrate having a circuit pattern formed thereon and is installed in an apparatus body. In such an electronic apparatus, for example, electromagnetic waves that are generated from the circuit substrate to which the circuit element is mounted may become a problem. In such a case, to shield against, for example, electromagnetic waves, the circuit substrate having the circuit element mounted thereto is accommodated in a shield case and, then, installed in the apparatus body (refer to JP-A-2001-268291).

A cutout portion for passing a cable that electrically connects the circuit element in the case and a circuit element outside the case to each other is formed in the shield case. Connectors are connected to respective two ends of the cable. When the shield case having this structure is installed in the apparatus body, the connector at one end of the cable is connected to a connector of the circuit element outside the case, and the circuit substrate having the circuit element mounted thereto is accommodated in the shield case. In addition, the other end of the cable is inserted into the cutout portion of the shield case and the connector at the other end of the cable is connected to a connector provided on the circuit substrate, after which the shield case is installed in the apparatus body.

Here, when an electronic apparatus has multiple functions, for example, the number of control signals is large, thereby increasing the number of connectors. To visually check and determine connection states of all of the connectors in the shield case after installing the shield case in the apparatus body, the opening area of the cutout portion that is formed in the shield case is increased. However, when the area of the cutout portion is increased, for example, electromagnetic waves tend to leak from the cutout portion.

SUMMARY

An advantage of the invention is that it provides a component accommodating case which accommodates an electronic component, which allows easy confirmation of a connection state of a wire from a cutout portion that passes the wire therethrough and which can reliably shield against leakage of, for example, electromagnetic waves from the cutout portion, and that it provides an electronic apparatus including the component accommodating case.

To this end, according to a first aspect of the invention, there is provided a component accommodating case for accommodating an electronic component that is connected to a wire. The case has a cutout portion that passes the wire therethrough, and a plate member that covers the cutout portion and that is mounted to the external case. By virtue of this structure, even if the opening area of the cutout portion is large, the plate member can reliably shield against leakage of, for example, electromagnetic waves. In addition, since the opening area of the cutout portion is large, even if there are many wires, connection states of the wires can be easily confirmed from the cutout portion.

It is desirable that at least one of the plate member and the external case be provided with a rib that prevents contact between an edge defining the cutout portion and the wire. By virtue of this structure, since, when the external case is mounted, the plate member can also be mounted at the same time, the plate member is easily and reliably mounted. In addition, it is possible to prevent scratching of the wire resulting from rubbing between the wire and an edge defining the cutout portion.

To this end, according to a second aspect of the invention, there is provided an electronic apparatus including any one of the above-described component accommodating cases. It is desirable that the electronic apparatus be a recording apparatus that performs recording on a recording medium. Accordingly, an electronic apparatus or a recording apparatus providing the aforementioned advantages is provided.

BRIEF DESCRIPTION OF THE DRAWINGS

The invention will be described with reference to the accompanying drawings, wherein like numbers reference like elements.

FIG. 13 is a sectional plan view in which the rear cover shown in FIG. 8 is mounted to the housing.

DESCRIPTION OF EXEMPLARY EMBODIMENTS

An embodiment of the invention will be described with reference to the drawings. The embodiment that is described below does not limit the inventions related to claims. In addition, all combinations of features described in the embodiment are not necessarily required for solving the related problems by the invention.

Figure 1:
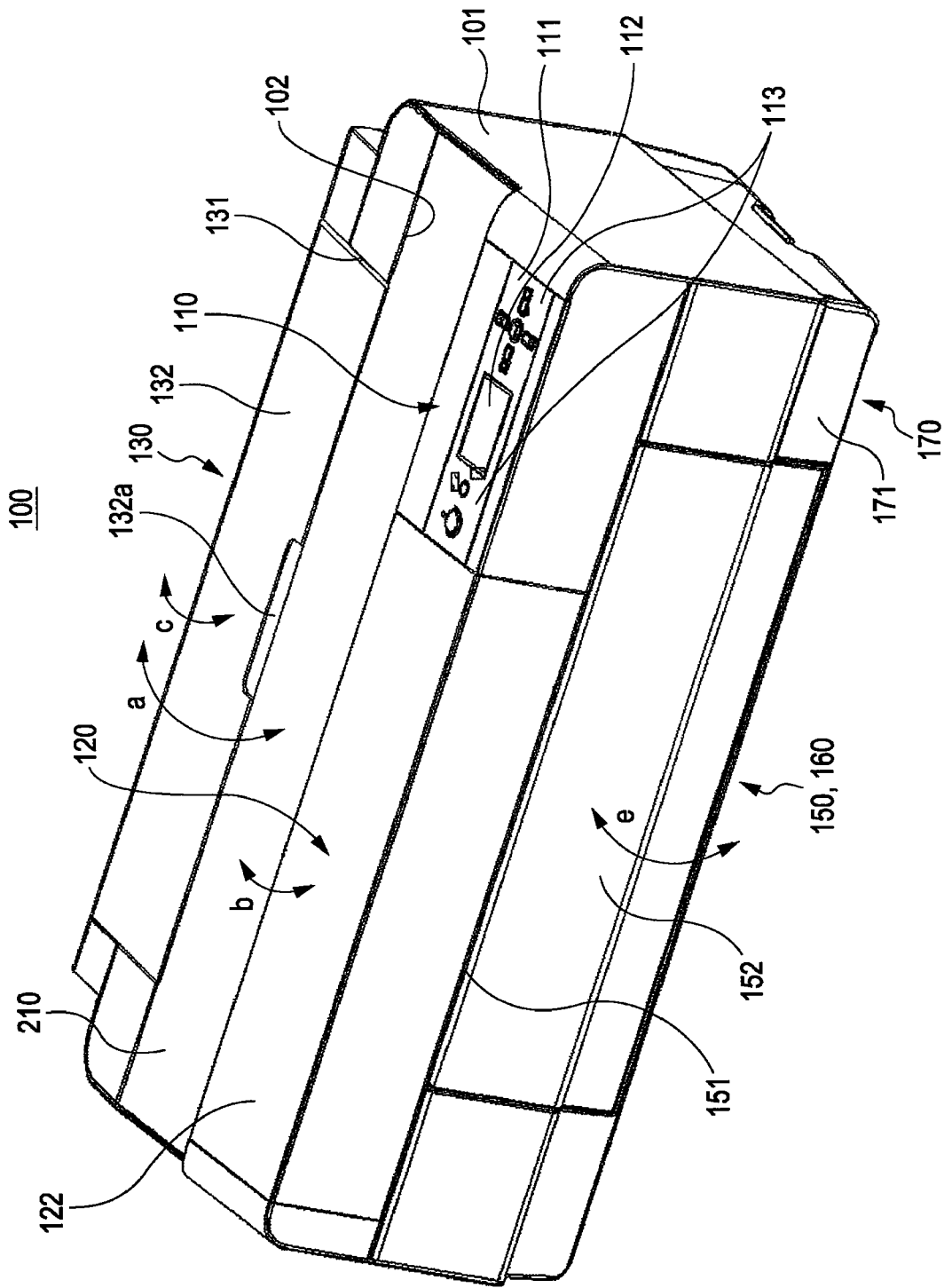
FIG. 1 is a perspective view of an entire external structure of an ink jet printer, which is one type of recording apparatus, according to an embodiment of the invention as seen obliquely from the front.
Figure 2:
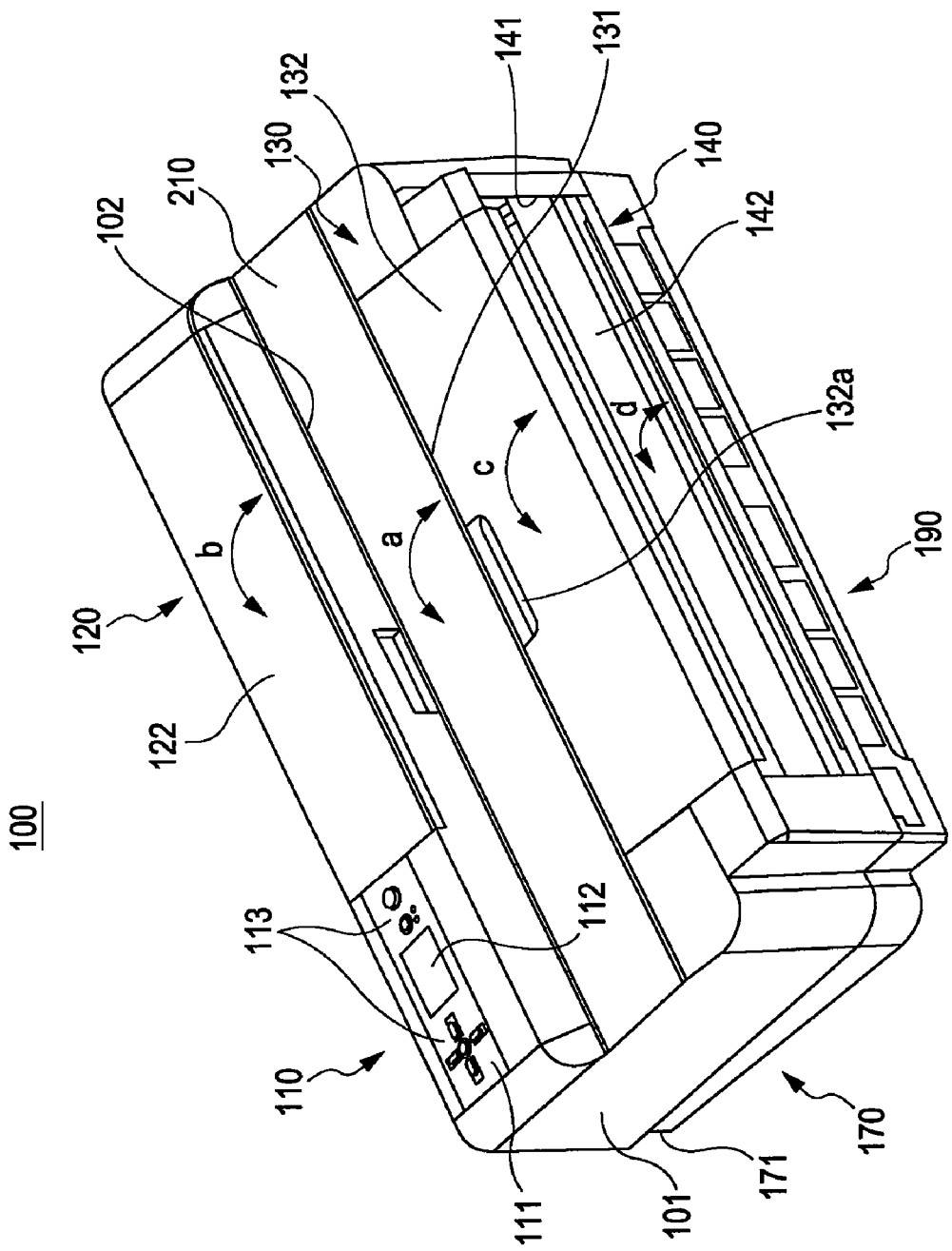
FIG. 2 is a perspective view of the entire external structure of the printer shown in FIG. 1 as seen obliquely from the back.
Figure 3:
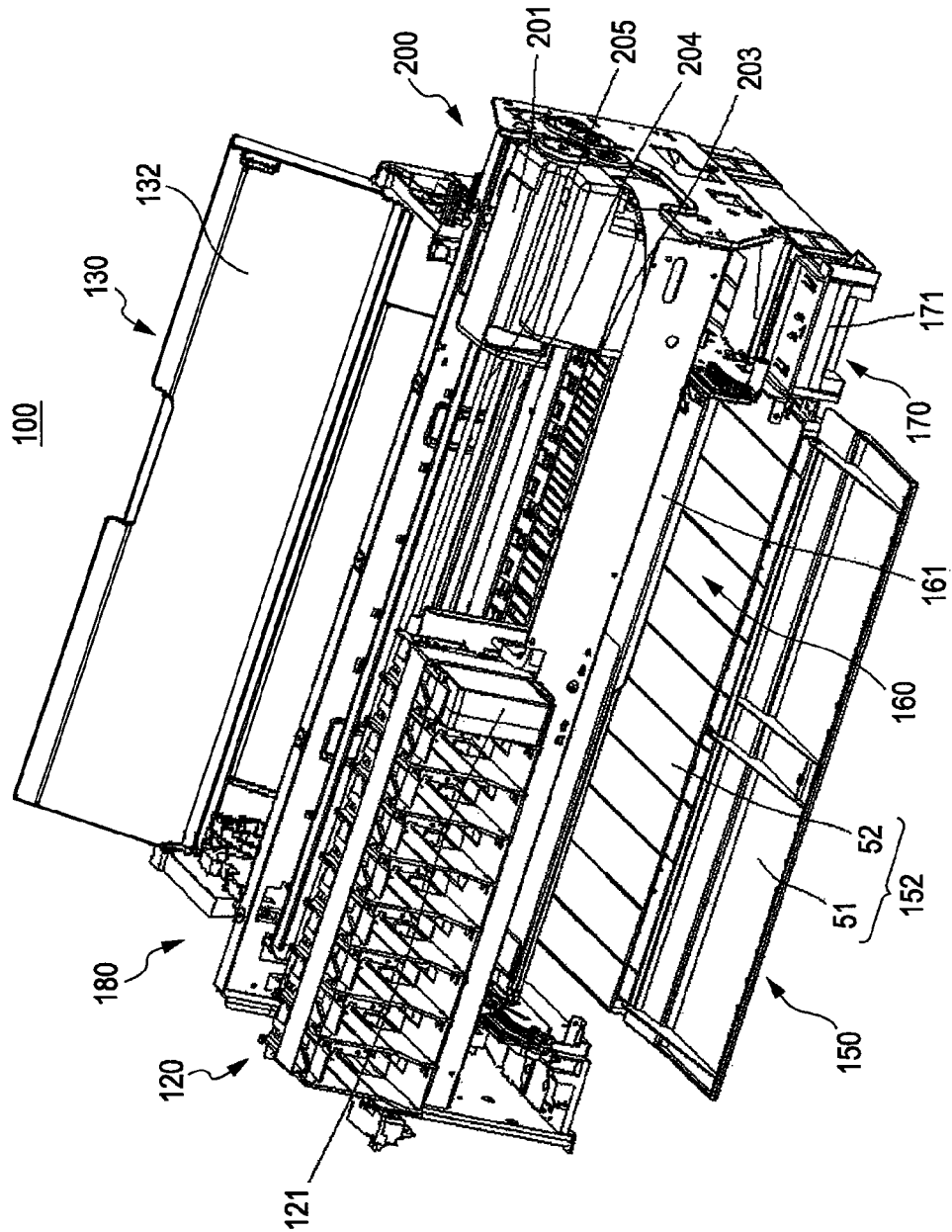
FIG. 3 is a schematic perspective view of an internal structure of the printer shown in FIG. 1.
Figure 4:
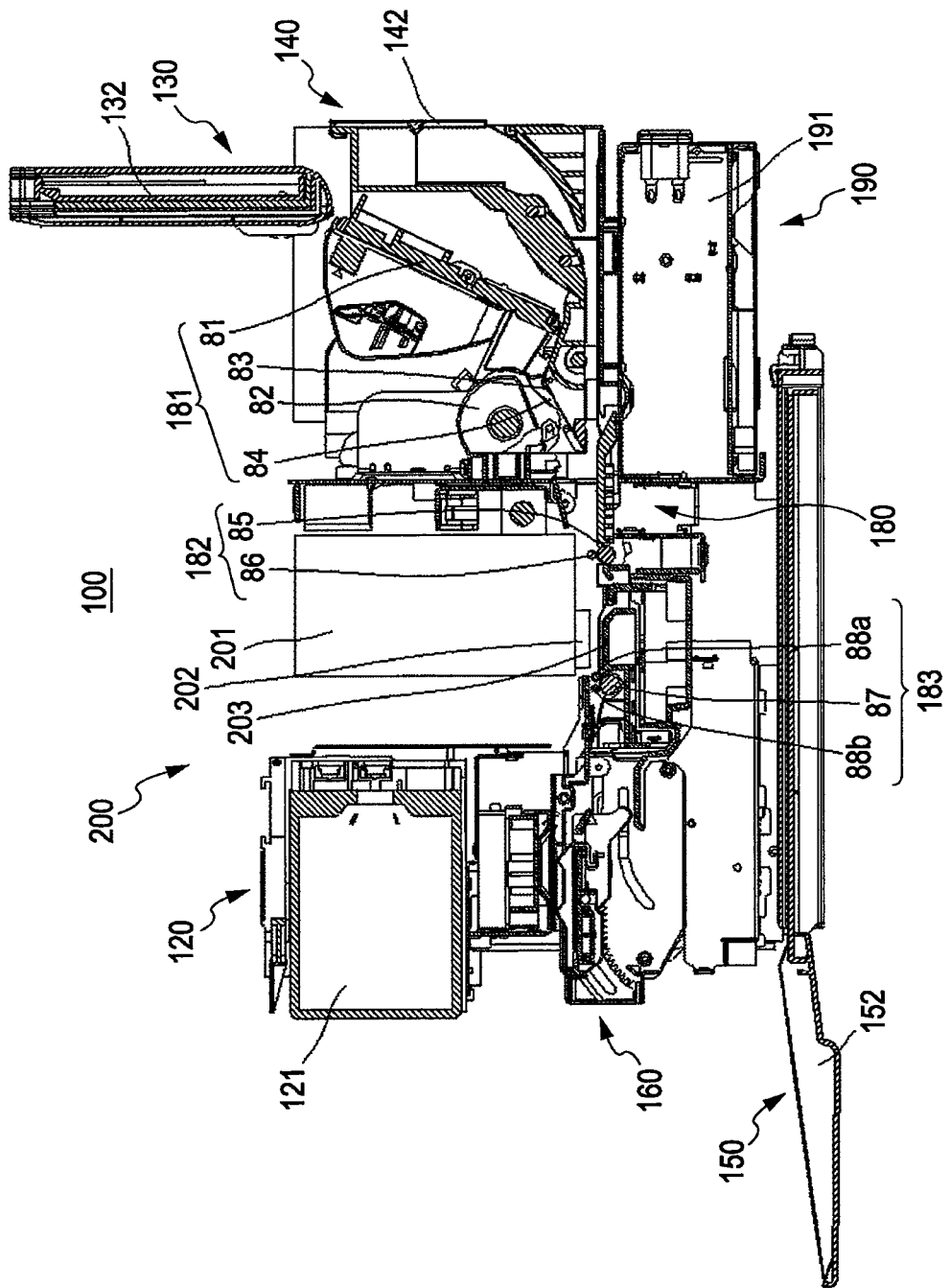
FIG. 4 is a schematic side sectional view of the internal structure of the printer shown in FIG. 1.

FIGS. 1 and 2 are perspective views of an entire external structure of an ink jet printer, which is a recording apparatus, according to the embodiment of the invention, as seen obliquely from the front and back, respectively. FIG. 3 is a schematic perspective view of an internal structure of the printer, and FIG. 4 is a schematic sectional side view of the internal structure of the printer. An ink jet printer 100 can perform a recording operation on a cut paper (hereunder referred to as "sheet (recording medium)") with ink. The sheet has, for example, an A4 size, an A3-nobi size, or an A2 size of JIS, is a postcard, or has an L size/2L size.

As shown in FIGS. 1 and 2, the entire ink jet printer 100 is covered with a substantially rectangular parallelepipedic housing 101. An operating unit 110 is disposed at the right front side of the upper surface (shown in FIG. 1) of the housing 101, and a cartridge accommodating unit 120 is disposed at the left front side of the upper surface (shown in FIG. 1) of the housing 101. A first rear sheet feeder 130 is disposed at the back side of the upper surface (shown in FIG. 1) of the housing 101, and a second rear sheet feeder 140 is disposed at the back side (shown in FIG. 2) of the housing 101. A sheet discharger 150 and a front sheet feeder 160 are disposed at the front side (shown in FIG. 1) of the housing 101, and a waste ink recovering unit 170 is disposed at the right side of the front surface (shown in FIG. 1) of the housing 101. A controller 190 (shown in FIGS. 2 and 4), which includes a characteristic portion of the invention, and a sheet transporting unit 180 and a recording unit 200 (shown in FIGS. 3 and 4) are disposed in the interior of the ink jet printer 100.

As shown in FIGS. 1 and 2, a rectangular opening 102 is formed in a portion of the top surface of the housing 101 surrounded by the operating unit 110, the cartridge accommodating unit 120, and the first rear sheet feeder 130. The opening 102 is covered with a substantially rectangular flat printer cover 210. The printer cover 210 is mounted so as to be rotatable in the directions of an illustrated double-headed arrow a around a rotary shaft as a center at its back end. By uncovering the opening 102 by lifting the printer cover 210, a user can easily, for example, maintain the internal mechanisms, such as the sheet transporting unit 180 and the recording unit 200, through the opening 102.

As shown in FIGS. 1 and 2, the operating unit 110 includes a substantially rectangular panel 111 and a liquid crystal panel 112 that is disposed at substantially the center of the operating panel 111 and that displays, for example, an operation state. Buttons 113 (for a power system that turns on/off power, an operating system that is operated to, for example, set the beginning of a sheet or perform ink flushing, and a processing system that, for example, processes an image) are provided on both sides of the liquid crystal panel 112. Since the user can operate the buttons 113 while visually checking the liquid crystal panel 112, it is possible to prevent an erroneous operation.

As shown in FIGS. 1 and 2, the cartridge accommodating unit 120 accommodates ink cartridges 121 (shown in FIGS. 3 and 4), which store ink of print colors (nine print colors in the embodiment), so as to be insertable into and removable from the cartridge accommodating unit 120. The cartridge accommodating unit 120 is covered with a cartridge cover 122 that is L-shaped in cross section. The cartridge cover 122 is mounted so as to be rotatable in the directions of an illustrated double-headed arrow b around a rotary shaft as a center at its back end. By uncovering the cartridge accommodating unit 120 by lifting the cartridge cover 122, the user can, for example, easily replace the ink cartridges 121, thereby making it possible to increase working efficiency.

The first rear sheet feeder 130 is for automatic sheet feeding (ASF). As shown in FIGS. 1 and 2, the first rear sheet feeder 130 has a first paper support 132 having a four-step structure that has a function of opening and closing an upwardly extending rectangular first sheet-feed opening 131 and a function of supporting one or a plurality of sheets to be fed. The first paper support 132 is mounted so as to be rotatable in the directions of a double-headed arrow c around a rotary shaft as a center at its back end. The sheet or sheets that are fed by the first rear sheet feeder 130 are relatively thin (for example, plain sheets or photography sheets having a thickness, for example, on the order of from 0.08 mm to 0.27 mm).

Prior to using the ink jet printer 100, the user places his/her finger in a hole 132a at the illustrated center front portion of the first paper support 132 and lifts up the first paper support 132 to draw out a multi-step portion, thereby completing the setting. Therefore, it is not necessary to perform, for example, a storage or a controlling operation required when a removable paper support is used. In addition, since the first paper support 132 is one having a multi-step structure, it can reliably support sheets to be fed having various sizes. Further, after using the ink jet printer 100, the first sheet-feed opening 131 can be covered by pushing and closing the multi-step portion of the first paper support 132. Therefore, it is possible to prevent entry of dust into the body of the printer and to compactly accommodate the first paper support 132.

The second rear sheet feeder 140 is for manual sheet feed. As shown in FIG. 2, the second rear sheet feeder 140 has a second paper support 142 having a two-step structure that has a function of opening and closing a backwardly extending rectangular second sheet-feed opening 141 and a function of supporting one sheet to be fed. The second paper support 142 is mounted so as to be rotatable in the directions of an illustrated double-headed arrow d around a rotary shaft as a center at its lower end. The one sheet to be fed by the second rear sheet feeder 140 is a sheet having a thickness that cannot be fed at a transportation angle in the first rear sheet feeder 130 (such as an art sheet or a dedicated sheet having a thickness, for example, on the order of from 0.29 mm to 0.48 mm). Since the first rear sheet feeder 130 is for automatic sheet feed (ASF), it picks up a sheet by a sheet-feed roller 82. When dust sticks to and accumulates on the sheet-feed roller 82, the sheet-feed roller 82 may slide and, thus, cause improper sheet feed. Therefore, even for sheets where dust tends to be produced (such as velvet fine art paper having a thickness on the order of 0.48 mm, and ultra smooth fine art paper having a thickness on the order of 0.46 mm), it is necessary to manually feed them by the second rear sheet feeder 140.

Prior to using the ink jet printer 100, the user places his/her finger on the illustrated top portion of the second paper support 142 and pushes down the second paper support 142 to draw out a multi-step portion, thereby completing the setting. Therefore, it is not necessary to perform, for example, a storage or a controlling operation required when a removable paper support is used. In addition, since the second paper support 142 is one having a multi-step structure, it can reliably support sheets to be fed having various sizes. Further, after using the ink jet printer 100, the second sheet-feed opening 141 can be covered by pushing and closing the multi-step portion of the second paper support 142. Therefore, it is possible to prevent entry of dust into the body of the printer and to compactly accommodate the second paper support 142.

As shown in FIG. 1, the sheet discharger 150 includes a stacker 152 having a two-step structure. The stacker 152 includes a first stacker portion 51 and a second stacker portion 52 (shown in FIG. 3) having a function of covering and uncovering a forwardly extending rectangular sheet-discharge opening 151 and a function of stacking one or a plurality of sheets that are discharged. The first stacker portion 51 is mounted so as to be rotatable in the directions of an illustrated double-headed arrow e around a rotary shaft as a center at the front end of the second stacker portion 52. The second stacker portion 52 is mounted so that it can protrude and be accommodated by moving in parallel obliquely vertically with respect to the sheet-discharge opening 151.

Prior to using the ink jet printer 100, the user places his/her finger on the top portion of the first stacker portion 51 and rotates the first stacker portion 51 towards the front to uncover the sheet-discharge opening 151. Then, the user holds the front end of the first stacker portion 51 with his/her finger and draws it out, so that the second stacker portion 52 is moved in parallel obliquely upward to make it protrude, thereby completing the setting. Therefore, it is not necessary to perform, for example, the storage or controlling operation required when a removable stacker is used. Since the stacker 152 is one having a multi-step structure, sheets to be discharged having various sizes can be reliably stacked in layers or the sheets that have been subjected to recording are always discharged from the front side. Therefore, the user can easily take out the sheets. After using the ink jet printer 100, it is possible to accommodate the second stacker portion 52 by moving it in parallel obliquely downward as a result of pushing in the front end of the first stacker portion 51 with one's hand. In addition, it is possible to cover the sheet-discharge opening 151 by placing the hand on the first stacker portion 51 and rotating the first stacker portion 51 towards the back. Therefore, it is possible to prevent entry of dust into the body of the printer and to compactly accommodate the stacker 152.

The front sheet feeder 160 is for manual sheet feed. As shown in FIG. 3, it includes a sheet-feed tray 161 disposed above the stacker portion 152 in the sheet-discharge opening 151. The sheet-feed tray 161 is provided so as to be movable horizontally with respect to the sheet-discharge opening 151. Sheets that are fed by the front sheet feeder 160 are those that are relatively thick that cannot be bent when transporting them (such as mat boards having a thickness, for example, on the order of 1.2 mm).

Prior to using the ink jet printer 100, the user lightly pushes in the front end of the sheet-feed tray 161 to disengage a stopper of the sheet-feed tray 161, thereby causing the sheet-feed tray 161 to protrude from the sheet-discharge opening 151. After using the ink jet printer 100, by lightly pushing in the front end of the sheet-feed tray 161, the stopper of the sheet-feed tray 161 is engaged to accommodate the sheet-feed tray 161 in the sheet-discharge opening 151. Therefore, it is possible to improve the space utilization of the sheet-feed tray 161.

As shown in FIGS. 1 to 3, the waste ink recovering unit 170 accommodates a waste ink tank 171 (which stores, for example, waste ink) so that the waste ink tank 171 can be inserted into and removed from the waste ink recovering unit 170. The waste ink tank 171 stores, for example, the waste ink that is exhausted when cleaning a recording head 202 or replacing any of the ink cartridges. When the waste ink tank 171 is filled with, for example, the waste ink, the user draws out the waste ink tank 171 and inserts another waste ink tank 171. This makes it easier to replace the waste ink tank 171.

As shown in FIGS. 3 and 4, the sheet transporting unit 180 is provided from the first rear sheet feeder 130 and the second rear sheet feeder 140 to the sheet discharger 150. It includes an automatic sheet-feed mechanism 181, a transporting mechanism 182, and a sheet-discharge mechanism 183. As shown in FIG. 4, the automatic sheet-feed mechanism 181 includes, for example, a hopper 81, the sheet-feed roller 82, a retard roller 83, and a sheet-returning lever 84. The hopper 81 lifts up sheets that are supported by the first paper support 132 to feed them. The sheet-feed roller 82 takes out the sheets lifted by the hopper 81. The retard roller 83 separates one at a time the sheets that are double-fed by the sheet-feed roller 82.

The sheet-returning lever 84 returns the remaining sheets separated by the retard roller 83 to the hopper 81.

The hopper 81 is formed with a flat shape so as to allow sheets to be placed thereupon, and is disposed substantially parallel to a back wall. The lower end of the hopper 81 is positioned near the sheet-feed roller 82, and the upper end thereof is disposed so as to be positioned near the top portion of the back wall. A compression spring (not shown) having one end mounted to the back wall has its other end mounted to the back surface at the lower end side of the hopper 81. The hopper 81 is disposed so that the lower end side of the hopper 81 is rotatable around its upper end side as a center by expansion and compression of the compression spring.

The sheet-feed roller 82 is formed into a D shape having a portion of its cross section cut out, and is disposed near the lower end of the hopper 81. The sheet-feed roller 82 rotates intermittently so as to frictionally feed the sheets that are lifted by the hopper 81. The retard roller 83 is disposed so that it can contact the sheet-feed roller 82, and is such as to frictionally separate only the topmost sheet from the lower sheets below the topmost sheet when the sheets are double-fed by the sheet-feed roller 82. The sheet-returning lever 84 is formed in the shape of a pawl and is disposed near the sheet-feed roller 82. The lower sheets that have been separated by the retard roller 83 are caught by the pawl to return them to the hopper 81.

As shown in FIG. 4, the transporting mechanism 182 includes, for example, a sheet-transporting roller 85 and a driven roller 86, which transport sheets in a sub-scanning direction in synchronism with a recording operation. The sheet-transporting roller 85 is disposed upstream from a platen 203 in the direction of sheet transportation. The sheet-transporting roller 85 and the driven roller 86 nip a sheet that is fed by the sheet-feed roller 82 to send the sheet to the platen 203.

As shown in FIG. 4, the sheet-discharge mechanism 183 includes, for example, a sheet-discharge roller 87, a first serrated roller 88a, and a second serrated roller 88b. The first serrated roller 88a is disposed downstream from the platen 203 in the direction of sheet transportation, and the second serrated roller 88b and the sheet-discharge roller 87 are disposed downstream from the first serrated roller 88a in the direction of sheet transportation so as to oppose each other. The sheet that has passed the platen 203 is first discharged from the first serrated roller 88a and is, then, nipped by the second serrated roller 88b and the sheet-discharge roller 87 to discharge the sheet onto the stacker 152. The first serrated roller 88a and the second serrated roller 88b are held by the same holding member (not shown).

As shown in FIG. 4, the controller 190 includes an enclosure (component accommodating case) 191 that accommodates a power supply substrate and a main substrate of a printer controller. The controller 190 controls, for example, the recording unit 200 and the sheet transporting unit 180 of a print engine. The controller 190, which includes a characteristic portion of the invention, will be described in more detail below with reference to the drawings.

As shown in FIG. 4, the recording unit 200 includes, for example, a carriage 201 that moves in a main scanning direction in synchronism with a recording operation, the recording head 202 that discharges ink in synchronism with the recording operation, and the platen 203 that holds the sheet in a flat state during the recording. As shown in FIG. 3, the carriage 201 passes through a carriage guide shaft 204 above the platen 203 and is connected to a carriage belt 205. When the carriage belt 205 is operated by a carriage motor (not shown), the carriage 201 is moved by the movement of the carriage belt 205 and is guided along the carriage guide shaft 204, so that it reciprocates.

As shown in FIG. 4, the recording head 202 is mounted to the carriage 201 so that a predetermined interval is provided between the recording head 202 and the platen 203. It can discharge ink of two types of black, such as photo-black and matte black, and ink of seven colors, yellow, cyan, light cyan, magenta, light magenta, gray, and red. In other words, the recording head 202 includes a nozzle plate having a pressure generating chamber and a nozzle connected to the pressure generating chamber. By storing the ink in the pressure generating chamber and applying a predetermined pressure thereto, an ink droplet having a controlled size is discharged towards the sheet from the nozzle. The platen 203 is disposed between the sheet-transporting roller 85 and the sheet-discharge roller 87 so as to oppose the recording head 202, and supports a surface of the sheet that is being transported. Next, the controller 190, which includes a characteristic portion of the invention, will be described in more detail with reference to the drawings.

Figure 5:
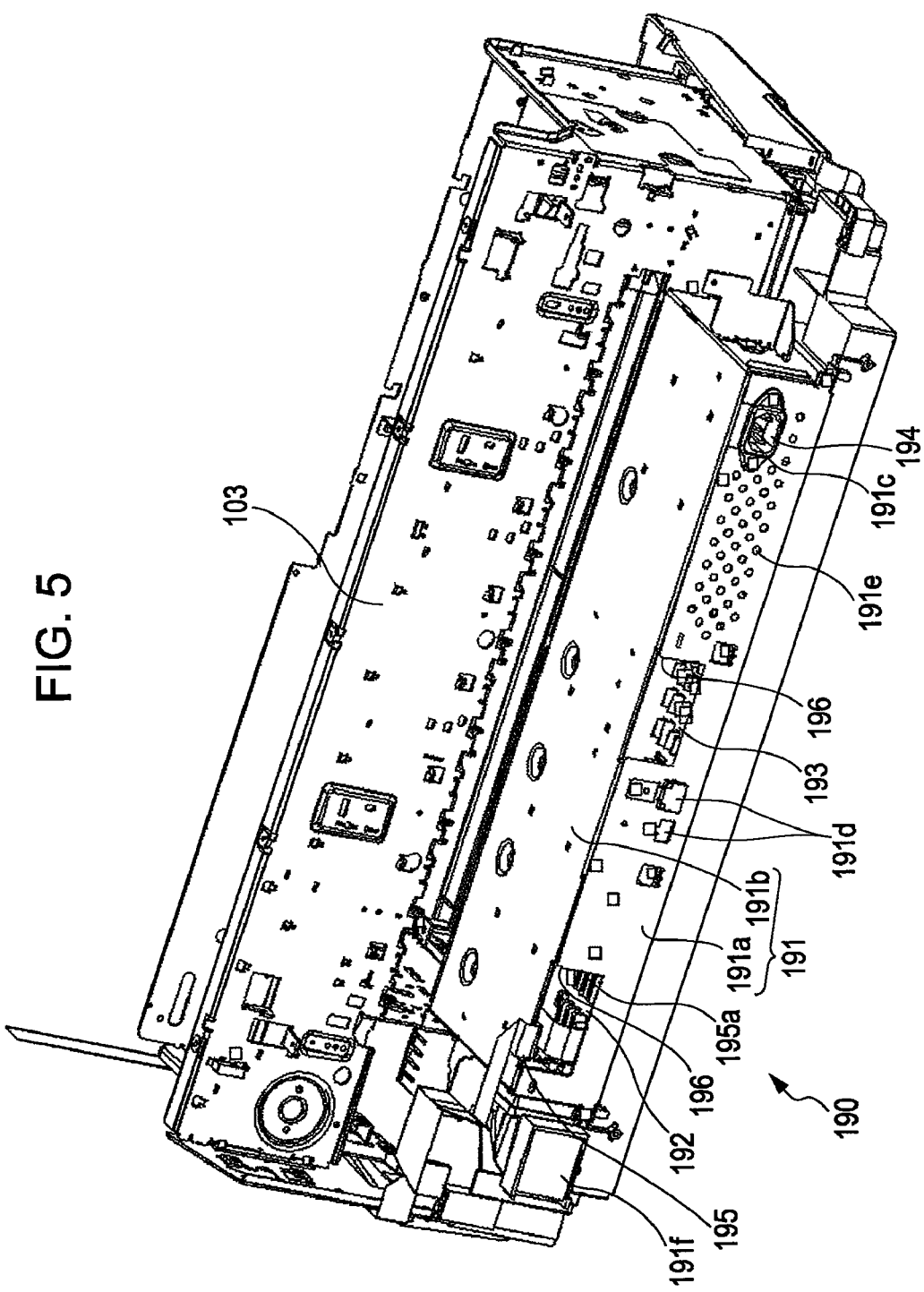
FIG. 5 is a rear perspective view of the printer shown in FIG. 1 in which a controller of the printer is exposed.
Figure 6:
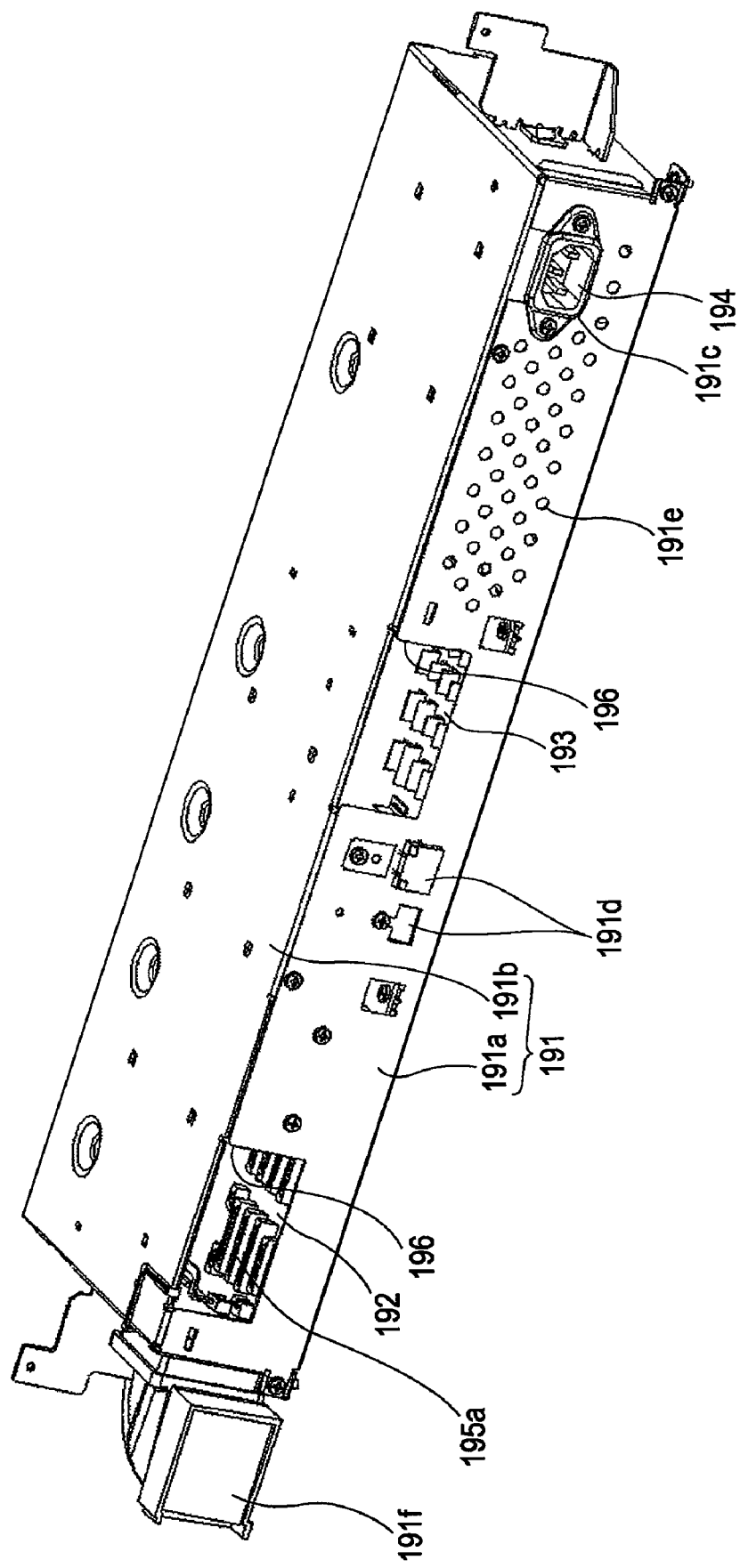
FIG. 6 is a perspective view of an enclosure of the controller shown in FIG. 5.
Figure 7:
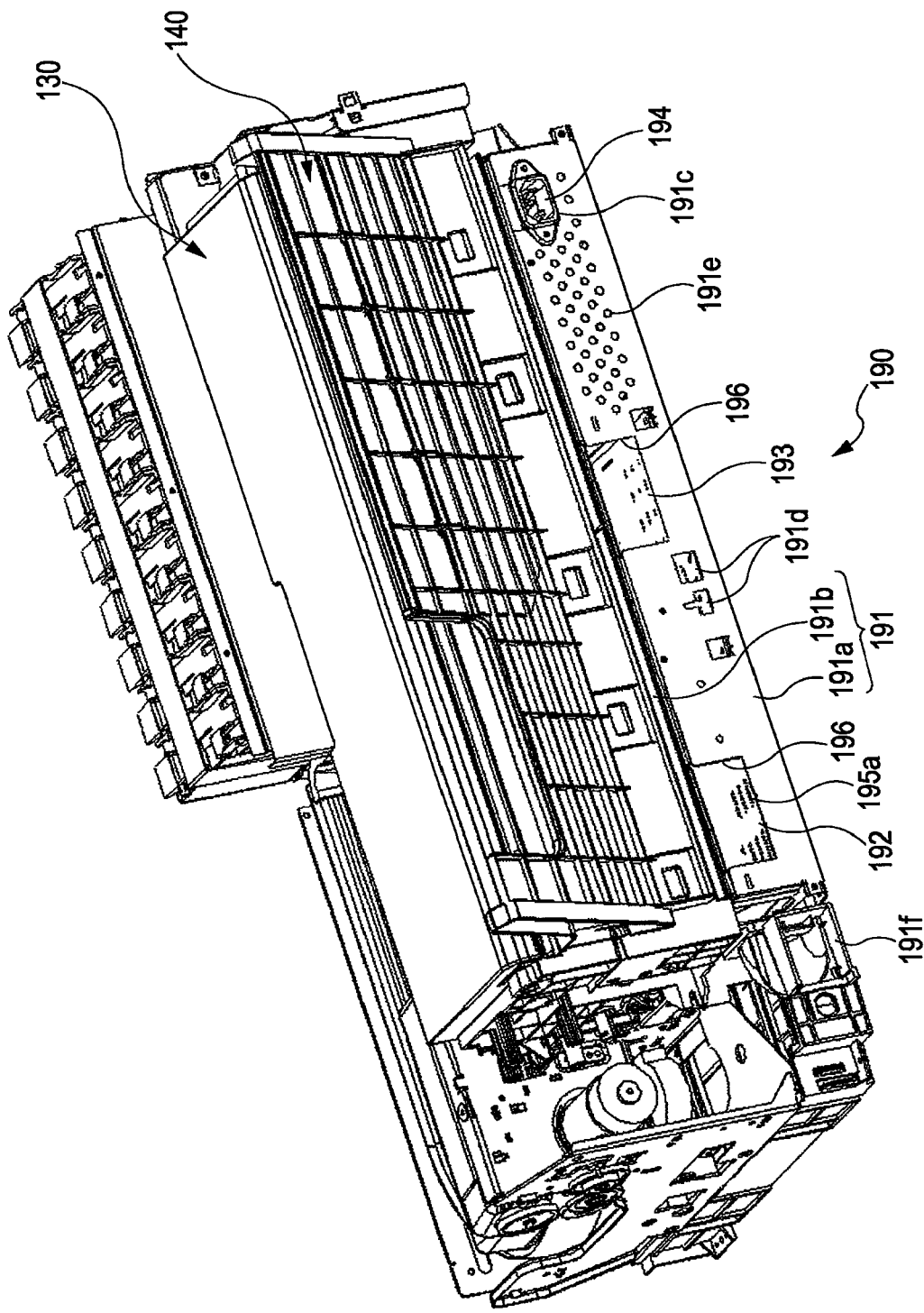
FIG. 7 is a rear perspective view of the printer shown in FIG. 1 in which the controller of the printer is installed.

FIG. 5 is a perspective rear view of the printer in which the controller 190 is exposed. FIG. 6 is a perspective view of the enclosure 191. FIG. 7 is a rear perspective view of the printer in which the controller 190 is installed. The controller 190 includes the enclosure 191 shown in FIG. 5, and is provided at the bottom portion of the rear side of the ink jet printer 100, that is, below the first rear sheet feeder 130 and the second rear sheet feeder 140 shown in FIG. 7, and behind a main frame 103 shown in FIG. 5.

The enclosure 191 mechanically protects a main substrate (electronic component) 192 and a power supply substrate (electronic component) 193. The main substrate 192 has mounted thereon a connector (electronic component), a CPU (electronic component), ROM (electronic component), RAM (electronic component), ASIC (electronic component), a transistor (electronic component), a capacitor (electronic component), etc. The power supply substrate 193 has mounted thereon a connector (electronic component), a transformer (electronic component), a capacitor (electronic component), etc. The enclosure 191 also shields against, for example, electromagnetic waves produced from the various electronic components.

As shown in FIGS. 5 and 6, the enclosure 191 is, for example, a box-shaped enclosure formed of a plate made of, for example, aluminum. The enclosure 191 includes a case body 191a and a case cover 191b. The top side of the case body 191a is open. The main substrate 192, the power supply substrate 193, etc. are accommodated from the open side and secured with, for example, screws. The case cover 191b is secured with, for example, screws so as to cover the open portion of the case body 191a.

An opening 191c, which allows a power supply connector 194 to be exposed to the outside, openings 191d, which allow external interface connectors (not shown) to be exposed to the outside, a plurality of air inlet openings 191e, and a discharge opening 191f are formed in the back side of the enclosure 191. Outside air that is sucked in from the air inlet openings 191e by rotation of a cooling fan (not shown) absorbs heat generated by the main substrate 192, the power supply substrate 193, various circuit elements mounted on these substrates 192 and 193, etc., and is discharged from the discharge opening 191f.

Two cutout portions 196 that pass flexible flat cables 195 that transmit a control signal, a drive signal, etc. are formed in the rear surface of the enclosure 191. The two cutout portions 196 have relatively large opening areas. These cutout portions 196 are required for passing many flexible flat cables 195 because the ink jet printer 100 according to the embodiment has relatively many functions. In addition, these cutout portions 196 are required because, depending upon a signal, connectors 195a for connection to these flexible flat cables 195 are required to be spaced apart from each other by a certain distance since they cannot be concentrated at one location, and because the connectors 195a need to be disposed where they can be easily connected. As shown in FIG. 7, even after installing the enclosure 191 in the body of the printer and mounting the first rear sheet feeder 130 and the second rear sheet feeder 140 to the body of the printer, it is possible to visually check the connection states of all of the connectors 195a by viewing the interior of the enclosure 191 from the cutout portions 196.

Here, when the cutout portions 196 having relatively large opening areas are provided, electromagnetic waves, etc. tend to leak from the cutout portions 196, thereby impairing the function of the enclosure 191 of shielding against, for example, electromagnetic waves generated from the various electronic components. To overcome this problem, a shield plate that shields the cutout portions 196 is provided. When the shield plate is provided as a separate part, it is necessary to mount the shield plate to the enclosure 191, and, then, further mount a rear cover of the ink jet printer 100. However, it is difficult to mount them with high precision, and it may be troublesome to perform the mounting operations. To overcome these problems, the following structure is used in the embodiment and will be described with reference to the drawings.

Figure 8:
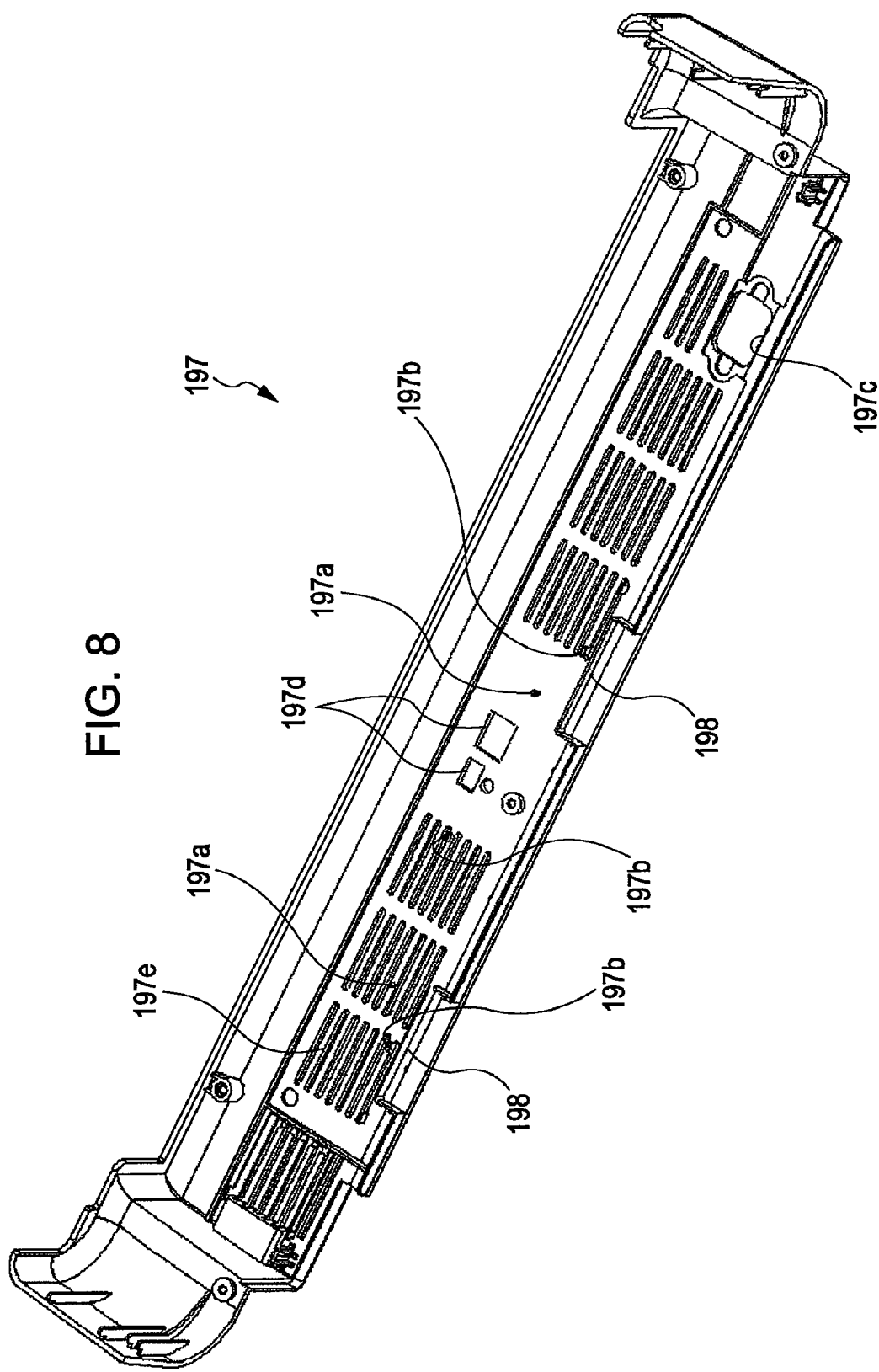
FIG. 8 is a perspective view of a rear cover of the printer shown in FIG. 1.
Figure 9:
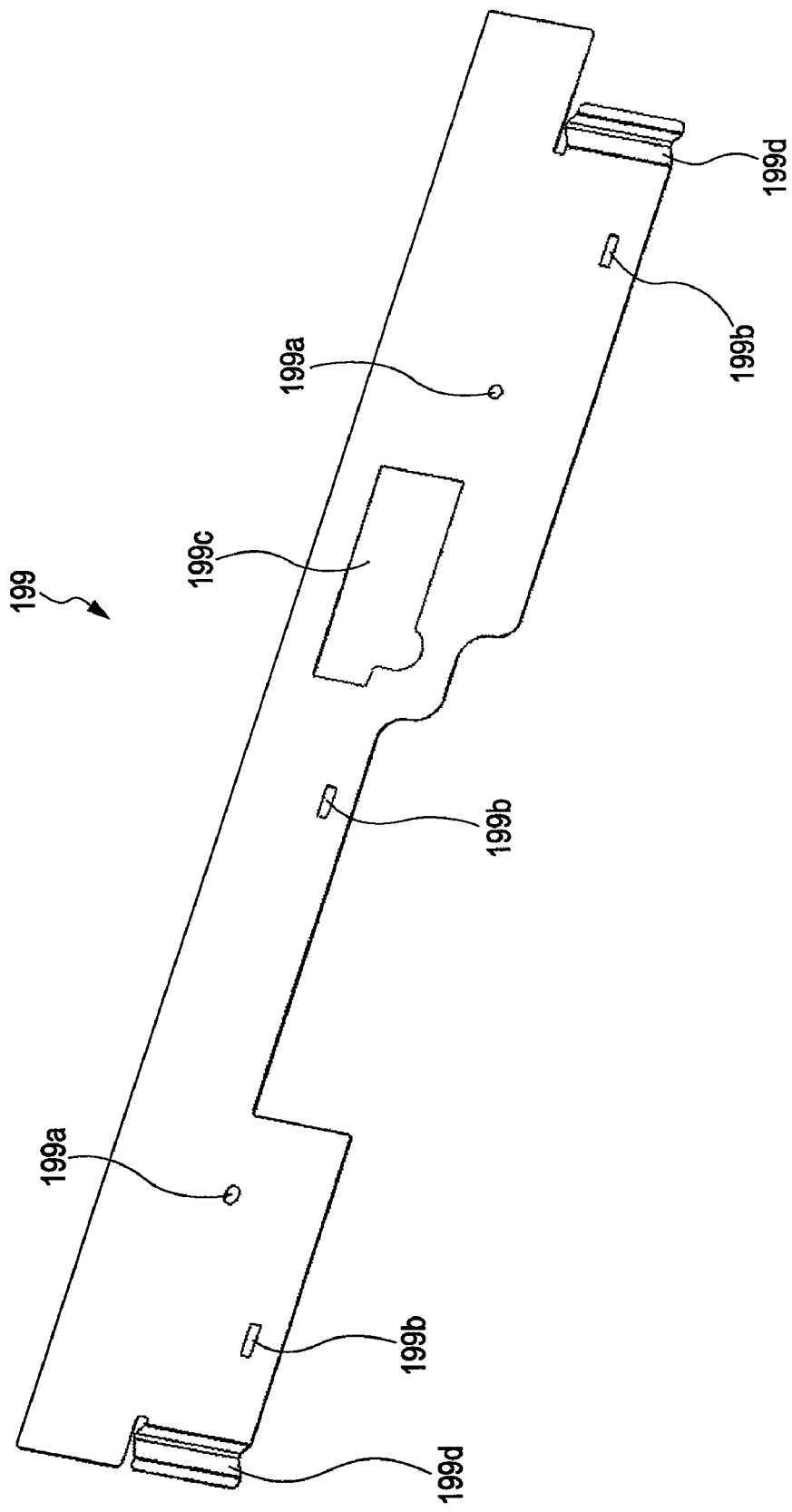
FIG. 9 is a perspective view of a shield plate of the printer shown in FIG. 1.
Figure 10:
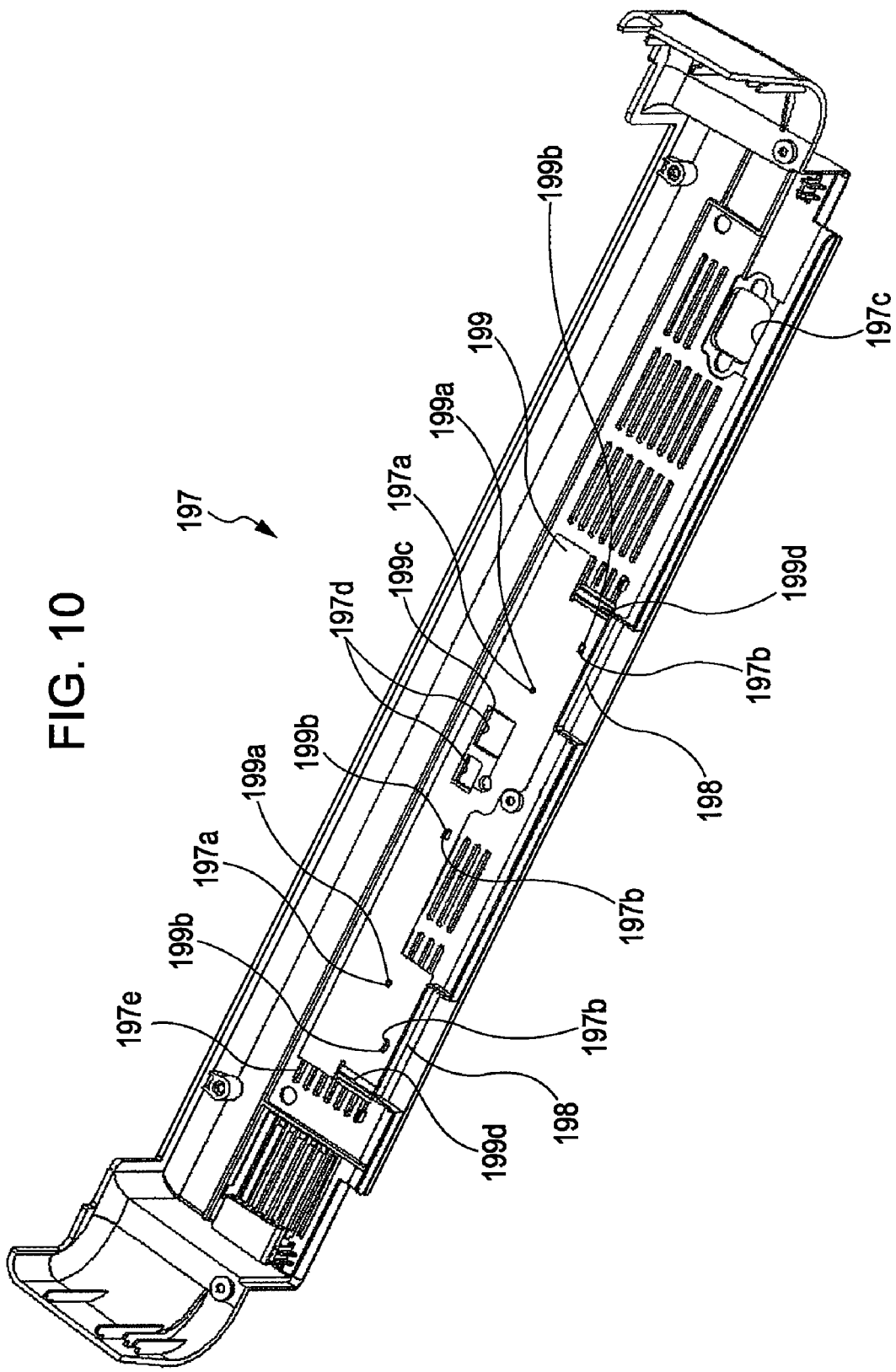
FIG. 10 is a perspective view showing a state in which the shield plate is mounted to the rear cover.

FIG. 8 is a perspective view of a rear cover. FIG. 9 is a perspective view of a shield plate. FIG. 10 is a perspective view showing a state in which the shield plate is mounted to the rear cover. As shown in FIG. 8, a rear cover (external case) 197 is formed of, for example, plastic and is formed into the form of a strip having a substantially U shape as viewed from the top so as to allow the rear cover 197 to substantially cover the back side of the enclosure 191 and to be mounted to the housing 101. Ribs 198 are provided in the rear cover 197 so as to be positioned in correspondence with the cutout portions 196 of the enclosure 191. In addition, positioning pins 197a and securing hooks 197b are provided at the rear cover 197 so as to protrude from locations where a shield plate 199 is mounted. Further, an opening 197c and openings 197d are provided in the rear cover 197 so as to be positioned in correspondence with the opening 191c and the openings 191d of the enclosure 191, and slits 197e for sucking air from the air inlet openings 191e are provided over substantially the entire surface of the rear cover 197.

As shown in FIG. 9, the shield plate (plate member) 199 is formed of, for example, a sheet plate and is formed into the form of a strip that allows the cutout portions 196 of the enclosure 191 other than portions thereof covered by the ribs 198 of the rear cover 197 to be completely covered. Positioning holes 199a and securing holes 199b are formed in the shield plate 199 so as to be positioned in correspondence with the positioning pins 197a and the securing hooks 197b of the rear cover 197. In addition, an opening 199c is provided in the shield plate 199 so as to be positioned in correspondence with the opening 191c and the openings 191d of the enclosure 191. Securing springs 199d are bent and formed at respective two ends of the shield plate 199.

In this structure, when mounting the shield plate 199 to the rear cover 197, as shown in FIG. 10, the positioning pins 197a and the securing hooks 197b of the rear cover 197 are aligned with the positioning holes 199a and the securing holes 199b of the shield plate 199. Then, by pushing the shield plate 199 against the rear cover 197, the springs 199d of the shield plate 199 are elastically deformed, and the securing hooks 197b of the rear cover 197 are elastically deformed. Thereafter, by pushing the shield plate 199 against the rear cover 197, the securing hooks 197b of the rear cover 197 are restored to their original states to engage the securing hooks 197b with the securing holes 199b of the shield plate 199.

Therefore, the shield plate 199 is firmly integrated to the rear cover 197 as a result of engaging the securing hooks 197b of the rear cover 197 due to the restoring force of the springs 199d. Consequently, by carrying out only a simple operation of mounting the rear cover 197 to the housing 101, it is possible to simultaneously cover the enclosure 191 with the rear cover 197 and cover and shield, in particular, the cutout portions 196 of the enclosure 191 with the shield plate 199.

Figure 11:
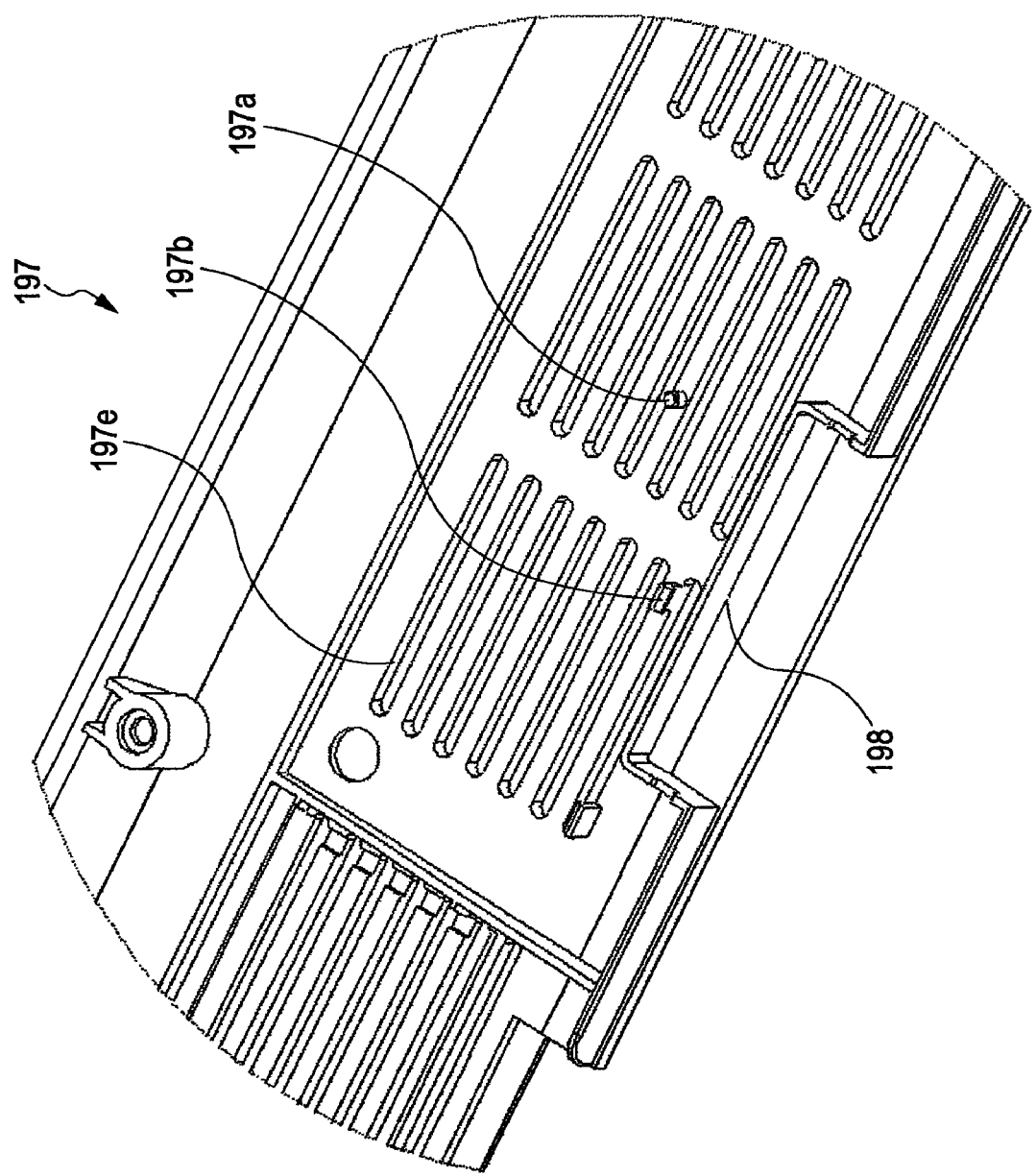
FIG. 11 is an enlarged perspective view showing in detail a rib of the rear cover shown in FIG. 8.

FIG. 11 is an enlarged perspective view showing in detail the rib 198 of the rear cover 197. When the enclosure 191 is covered with the rear cover 197, above the cutout portions 196, the ribs 198 are such that their upper ends are open and their left and right ends and the lower ends are formed into closed substantially U shapes. The operation of the ribs 198 when the rear cover 197 provided with the ribs 198 constructed as mentioned above is mounted to the housing 101 will be further described with reference to the drawings.

Figure 12:
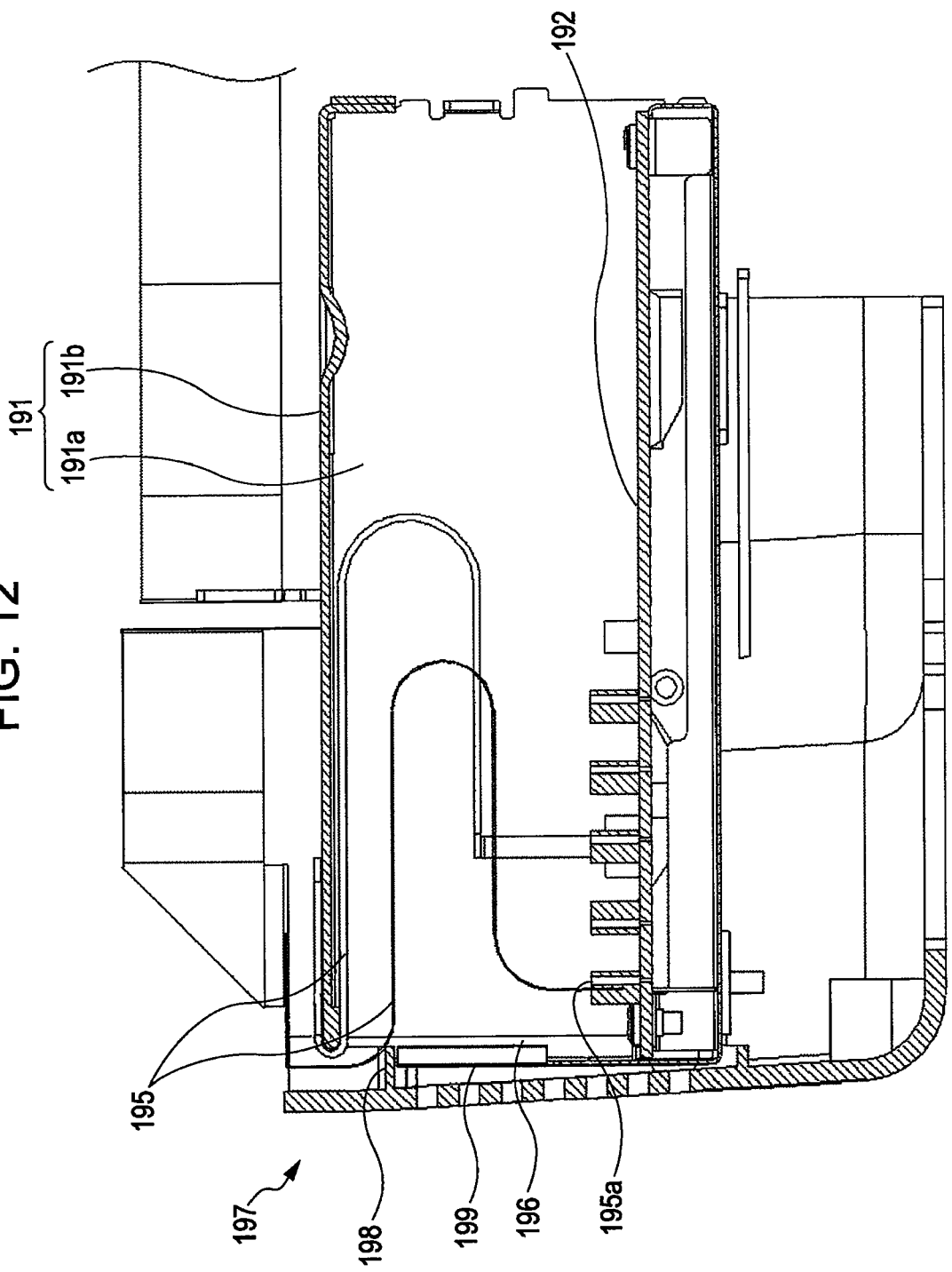
FIG. 12 is a sectional side view in which the rear cover shown in FIG. 8 is mounted to a housing.

FIGS. 12 and 13 are a sectional side view and a sectional plan view in which the rear cover 197 is mounted to the housing 101. The flexible flat cables 195 that are routed in the housing 101 are introduced into the enclosure 191 through the cutout portions 196 of the enclosure 191 from the ribs 198 of the rear cover 197. Then, the flexible flat cables 195 are routed into a substantially U shape so that a bending angle is not steep, and are connected to the connectors 195a mounted on the main substrate 192.

Since ends of the case cover 191b, formed of a sheet plate of the enclosure 191, are rounded, even if the ends of the case cover 191b contact the flexible flat cables 195, the flexible flat cables 195 do not get scratched due to rubbing. The edges defining the cutout portions 196 of the case body 191a, formed of the sheet plate of the enclosure 191, are sharp because they remain in a punched-out state. However, since they are covered with the ribs 198 of the rear cover 197 formed of plastic, the flexible flat cables 195 contact the ribs 198, so that the flexible flat cables 195 do not get scratched due to rubbing.

As mentioned above, the enclosure 191 according to the invention is provided with the shield plate 199 that covers the cutout portions 196 that pass the flexible flat cables 195 therethrough. Therefore, the shield plate 199 reliably shields against leakage of, for example, electromagnetic waves even if the opening areas of the cutout portions 196 are large. In addition, since the opening areas of the cutout portions 196 are large, even if many flexible flat cables 195 are used, it is possible to easily confirm the states of connections of the connectors 195a with the flexible flat cables 195 from the cutout portions 196.

The rear cover 197 is formed into a form that allows it to cover at least a surface where the cutout portions 196 are formed. Since the shield plate 199 is mounted to the rear cover 197, the shield plate 199 can also be mounted at the same time when mounting the rear cover 197, so that the shield plate 199 is easily and reliably mounted. In addition, although the ribs 198 are formed at the rear cover 197, even if they are formed at the shield plate 199, it is possible to prevent the flexible flat cables 195 from becoming scratched due to rubbing between the flexible flat cables 195 and the edges defining the cutout portions 196.

Although the ink jet printer is described as a recording apparatus including a component accommodating case, as long as the recording apparatus includes a component accommodating case, the invention is applicable to, for example, a facsimile or a copying machine. Moreover, the invention is applicable to any electronic apparatus including a component accommodating case in addition to a recording device.

What is claimed is:

1. A component accommodating case for accommodating an electronic component that is connected to a wire, the case comprising:
   a case body with a cutout portion that passes the wire therethrough;
   a plurality of openings formed in the case body which expose the electronic component so as to provide access to the electronic unit;
   an external case that covers at least a portion of the surface of the case body where the cutout portion is disposed which also has a second cutout portion that allows the wire of the electronic component to pass therethrough; and
   a plate member mounted within the external case so as to cover at least a portion of the plurality of openings which expose the electronic component so as to, shield any electromagnetic waves generated by the electronic component from being exposed via the portion of the plurality of openings, while containing a plate cutout portion corresponding to the second cutout portion of the external case that allows the wire of the electronic component to pass therethrough.

2. The component accommodating case according to claim 1, wherein at least one of the plate member and the external case is provided with a rib that covers the edges of the cutout portion of the case body so as to prevent contact between an edge defining the cutout portion and the wire.

3. An electronic apparatus comprising: the component accommodating case of claim 1.

4. The electronic apparatus according to claim 3, which is a recording apparatus that performs a recording operation on a recording medium.

* * * * *